United States Patent
Kim

(10) Patent No.: US 9,551,845 B1
(45) Date of Patent: Jan. 24, 2017

(54) METHOD FOR MANUFACTURING OPTICAL ENGINE PACKAGES AND APPARATUS FROM WHICH OPTICAL ENGINE PACKAGES ARE MANUFACTURED

(71) Applicant: PMC-Sierra US, Inc., Sunnyvale, CA (US)

(72) Inventor: Daniel Kim, Port Moody (CA)

(73) Assignee: Microsemi Storage Solutions (U.S.), Inc., Aliso Viejo, CA (US)

( * ) Notice: Subject to any disclaimer, the term of this patent is extended or adjusted under 35 U.S.C. 154(b) by 350 days.

(21) Appl. No.: 14/043,720

(22) Filed: Oct. 1, 2013

(51) Int. Cl.
*G02B 6/42* (2006.01)
*G02B 6/43* (2006.01)
*G02B 6/13* (2006.01)
*G02B 6/30* (2006.01)

(52) U.S. Cl.
CPC . *G02B 6/42* (2013.01); *G02B 6/13* (2013.01); *G02B 6/30* (2013.01); *G02B 6/4249* (2013.01); *G02B 6/43* (2013.01)

(58) Field of Classification Search
None
See application file for complete search history.

(56) References Cited

U.S. PATENT DOCUMENTS

| | | | | |
|---|---|---|---|---|
| 4,772,086 A * | 9/1988 | Bellerby | ............... | G02B 6/30 385/49 |
| 5,325,451 A * | 6/1994 | Hartman | ............... | C03C 4/0014 385/132 |
| 6,203,212 B1 | 3/2001 | Rosenberg et al. | | |
| 6,754,406 B2 | 6/2004 | Kaneshiro et al. | | |
| 7,129,100 B2 * | 10/2006 | Joyner | ............... | G02B 6/12011 438/14 |
| 7,539,384 B2 * | 5/2009 | Fujii | ............... | G02B 6/138 385/129 |
| 7,657,136 B2 * | 2/2010 | Matsuoka | ............... | G02B 6/42 385/129 |
| 8,023,790 B2 * | 9/2011 | Shimizu | ............... | G02B 6/1221 385/129 |
| 2002/0076163 A1 * | 6/2002 | Murali | ............... | G02B 6/30 385/49 |
| 2003/0002801 A1 * | 1/2003 | Vegny | ............... | G02B 6/30 385/52 |
| 2003/0128931 A1 * | 7/2003 | Kim | ............... | G02B 6/30 385/49 |

(Continued)

OTHER PUBLICATIONS

Reflex Photonics Inc., 120Gbps Surface Mount and Pluggable LightABLE(RTM) Optical Engine, retrieved from Internet Oct. 1, 2013, 2 pages.

*Primary Examiner* — Michelle R Connelly
(74) *Attorney, Agent, or Firm* — Dennis R. Haszko

(57) ABSTRACT

The present disclosure relates to a method for manufacturing one or more optical engine packages, each optical engine package comprising a silicon photonic die. The method includes receiving a substrate comprising a package portion and a cutting area adjacent to the package portion, assembling the optical engine package on the substrate such that an edge-coupled waveguide of the silicon photonic die overlaps a boundary between the cutting area and the package portion, and cutting the optical engine package and the substrate in the cutting area to expose the edge-coupled waveguide for optical coupling thereof to an optical fiber core.

5 Claims, 4 Drawing Sheets

(56) References Cited

U.S. PATENT DOCUMENTS

| | | | |
|---|---|---|---|
| 2003/0147583 A1* | 8/2003 | Saito | G02B 6/3502 385/17 |
| 2003/0190124 A1* | 10/2003 | Kuhara | G02B 6/4249 385/88 |
| 2011/0123150 A1 | 5/2011 | Zbinden et al. | |
| 2012/0057822 A1* | 3/2012 | Wu | G02B 6/136 385/49 |
| 2012/0104389 A1* | 5/2012 | Whitbread | G01M 11/00 257/48 |
| 2012/0205524 A1 | 8/2012 | Mack et al. | |
| 2013/0309801 A1* | 11/2013 | Hsiao | H01L 24/94 438/65 |

* cited by examiner

METHOD FOR MANUFACTURING OPTICAL ENGINE PACKAGES AND APPARATUS FROM WHICH OPTICAL ENGINE PACKAGES ARE MANUFACTURED

FIELD

The present disclosure relates to a method for manufacturing optical engine packages and an apparatus from which optical engine packages are manufactured.

BACKGROUND

An optical engine is a multi-chip module (MCM) that may include one or more silicon photonic dies that are electrically coupled to one or more silicon electronic dies. An optical engine may be packaged onto a single unifying substrate to facilitate its use as a single multi-chip module.

Known methods of packaging optical engines involve packaging optical engines one at a time. A known packaging method includes the steps of: placing one or more silicon photonic dies and one or more silicon electronic dies in close proximity to one another on a substrate; creating electrical interconnects between the one or more silicon photonic dies and the one or more silicon electronic dies; attaching an optical fiber core to each of the silicon photonic dies; and encapsulating the substrate, the one or more silicon photonic dies, the one or more silicon electronic dies, and the electrical interconnects to create an optical engine package. Encapsulation also protects the electrical interconnects from damage and potential electrical shorting.

Silicon photonics were developed to take advantage of the scalable manufacturing offered by silicon wafer processing. While standard silicon wafer processing can effectively produce optical components for optical engines, the back-end assembly process is unsuitable for forming packages using these silicon-based optical components because the step of attaching an optical fiber core to the silicon photonic dies before encapsulation renders a resulting partially completed multi-chip module incompatible with standard assembly processing flows.

Improvements in methods of assembling and packaging optical engines are therefore desirable.

BRIEF DESCRIPTION OF THE DRAWINGS

Embodiments of the present disclosure will be described, by way of example only, with reference to the attached figures.

DETAILED DESCRIPTION

Figure 1:
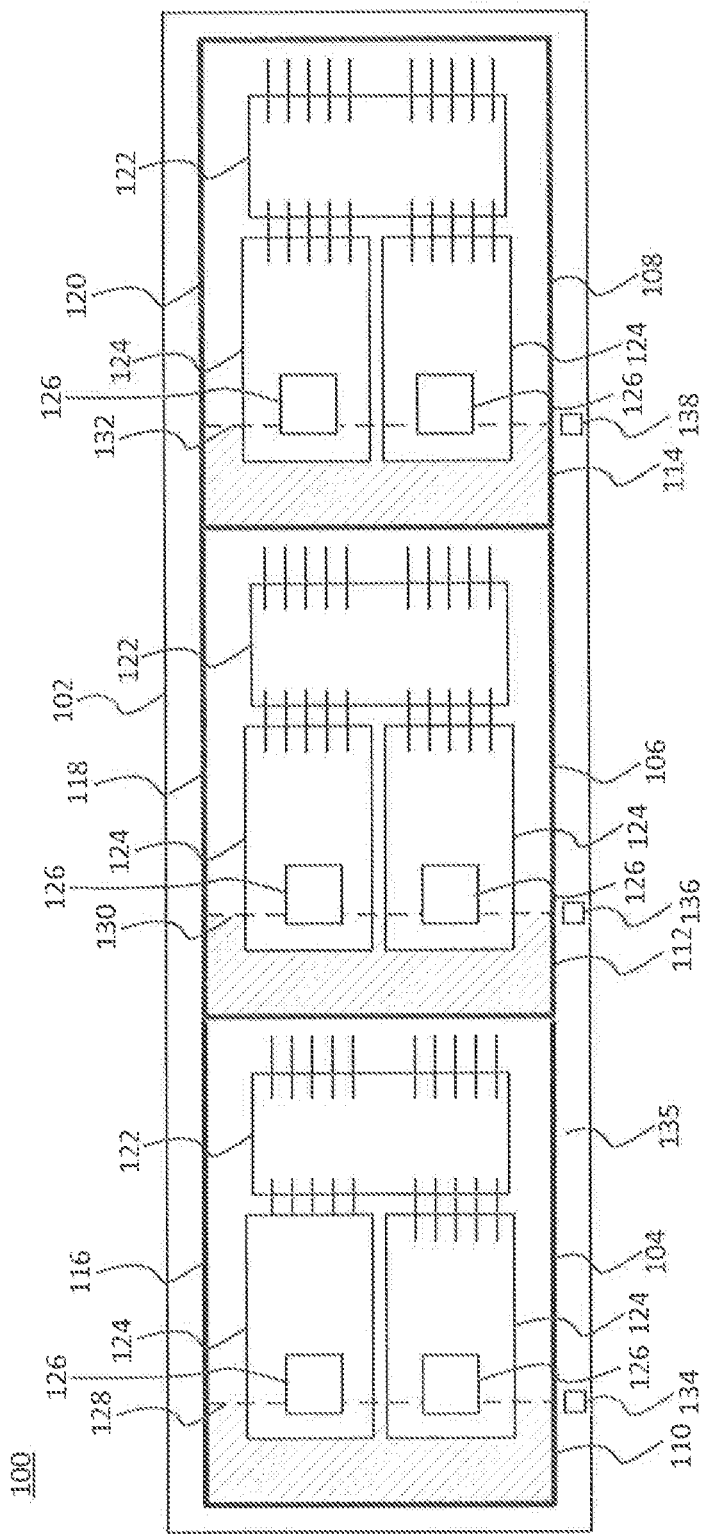
FIG. 1 is a partially cut away top view of an apparatus from which optical engine packages are manufactured in accordance with an embodiment of the present disclosure.

The following describes a method for manufacturing optical engine packages that include an edge-aligned silicon photonic die having an edge-coupled optical waveguide for facilitating coupling of the edge-coupled waveguide to an optical fiber core, and from apparatus from which optical engine packages are manufactured.

Standard silicon wafer processes does not interconnect useable electrical inputs and outputs or couple generated optical signals to an optical fiber. As a result, a method of manufacturing optical engine packages in accordance with the present disclosure provides a subassembly of silicon photonic dies interconnected with a silicon electronic die and enables access to a waveguide of the silicon photonic die for coupling an optical fiber thereto. No process currently exists that enables complete encapsulation of silicon photonic dies and silicon electronic dies within an optical engine package while facilitating access to the waveguides of the silicon photonic die for fiber coupling.

Thus, in an aspect, the present disclosure provides an apparatus from which one or more optical engine packages are manufactured. The apparatus includes a substrate comprising a package portion and an adjacent cutting area, and a first optical engine package. The first optical engine package includes an edge-aligned silicon photonic die that has an edge-coupled waveguide. The first optical engine package is disposed on both the package portion and the adjacent cutting area such that the edge-coupled waveguide of the silicon photonic die is overlaps a boundary between the cutting area and the package portion to facilitate cutting of the optical engine package to expose the edge-coupled waveguide for optical coupling thereof to an optical fiber core. The substrate may be a low temperature co-fired ceramic (LTCC) substrate. The substrate may be an organic laminate substrate. The first optical engine package may also include a silicon electronic die electrically interconnected to the silicon photonic die.

In another aspect, the apparatus of the present disclosure may include a second package portion and a second cutting area adjacent to the second package portion, and a second optical engine package that includes a second edge-aligned silicon photonic die having a second edge-coupled waveguide. The second optical engine package may be disposed on both the second package portion and the second cutting area such that the second edge-coupled waveguide of the second silicon photonic die overlaps a boundary between the second cutting area and the second package portion to facilitate cutting of the second optical engine package to expose the second edge-coupled waveguide for optical coupling of the second optical engine package to a second optical fiber core.

In another aspect, the present disclosure provides a method for manufacturing one or more optical engine packages that includes receiving an apparatus that includes a substrate and a first optical engine package. The substrate may include a package portion and an adjacent cutting area. The first optical engine package may include an edge-aligned silicon photonic die that has an edge-coupled waveguide. The first optical engine package may be disposed on both the package portion and the adjacent cutting area such that the edge-coupled waveguide of the silicon photonic die overlaps a boundary between the cutting area and the package portion. The method also includes cutting the first optical engine package and the substrate to separate the first optical engine package from the assembly and to expose the edge-coupled waveguide for optical coupling thereof to an optical fiber core.

In another aspect, the method includes cutting the apparatus, including the first optical engine package and the substrate, in the cutting.

In another aspect, the method includes cutting the apparatus, including the first optical engine package and the substrate, in the boundary.

In another aspect, the method includes polishing a surface of the exposed edge-coupled waveguide to facilitate light transmission between the edge-coupled waveguide and the optical fiber core. In another aspect, the method includes aligning the optical fiber core with the exposed edge-coupled waveguide and securing the optical fiber core to the edge-coupled waveguide.

In another aspect, the present disclosure provides a method for manufacturing one or more optical engine packages, each optical engine including a silicon photonic die. The method includes receiving a substrate comprising a package portion and a cutting area adjacent to the package portion, assembling a first optical engine package on the substrate, including placing the silicon photonic die on the package portion and the cutting area such that an edge-coupled waveguide of the silicon photonic die overlaps a boundary between the cutting area and the package portion, and cutting the substrate and the optical engine package to expose the edge-coupled waveguide for optical coupling thereof to an optical fiber core.

In another aspect, the method includes the cutting the substrate and the optical engine package in the cutting area.

In another aspect, the method includes the cutting the substrate and the optical engine package in the boundary.

In another aspect, the method includes polishing a surface of the exposed edge-coupled waveguide to facilitate light transmission between the edge-coupled waveguide and the optical fiber core.

In another aspect, the method includes aligning the optical fiber core with the exposed edge-coupled waveguide, and attaching the optical fiber core to the exposed edge-coupled waveguide.

In another aspect, the substrate may include at least one alignment marker for guiding assembly equipment to assemble the optical engine package on the substrate. In another aspect, assembling the optical engine package includes placing the silicon photonic die on the substrate based on the at least one alignment marker.

In another aspect, assembling the optical engine package further includes placing a silicon electronic die on the substrate based on the at least one alignment marker.

In another aspect, assembling the optical engine package further includes attaching the silicon photonic die and the silicon electronic die to substrate.

In another aspect, attaching includes attaching the silicon photonic die and the silicon electronic die to the substrate utilizing curable epoxy.

In another aspect, attaching includes attaching the silicon photonic die and the silicon electronic die to the substrate utilizing a die attach film.

In another aspect, assembling the optical engine package further includes electrically interconnecting the silicon photonic die and the silicon electric die.

In another aspect, electrically interconnecting includes wire bonding the silicon photonic die and the silicon electronic die to the substrate.

In another aspect, electrically interconnecting includes flip chip interconnecting the silicon photonic die and the silicon electronic die to the substrate.

In another aspect, assembling the optical engine package includes encapsulating the substrate.

In another aspect, encapsulating the substrate includes molding the substrate with a cap cured material.

In another aspect, the substrate comprises a second package portion and a second cutting area adjacent to the second package portion, and the method further includes: assembling a second optical engine package comprising a second silicon photonic die on the substrate such that a second edge-coupled waveguide of the second silicon photonic die of the second optical engine package overlaps a second boundary between the second cutting area and the second package portion; and cutting the substrate and the second optical engine package to expose the edge-coupled waveguide of the silicon photonic die of the second optical engine for optical coupling thereof to a second optical fiber core.

FIG. 1 shows a partially cut away top view of an embodiment of an apparatus 100 for manufacturing one or more optical engine packages. The apparatus 100 includes a substrate 102 with a generally rectangular shape. Alternatively, the substrate 102 may have a generally square shape, or any other suitable shape for the manufacturing described herein. The substrate 102 may be, for example, an organic laminate substrate or a low temperature co-fired ceramic (LTCC) substrate. The substrate 102 includes a plurality of package portions and a plurality of cutting areas. Each cutting area is adjacent to at least one of the package portions. In the embodiment shown in FIG. 1, the substrate 102 includes three package portions 104, 106, 108 and three cutting areas 110, 112, 114. The cutting area 110 is adjacent to the package portion 104, the cutting area 112 is adjacent to the package portions 104, 106, and the cutting area 114 is adjacent to the package portions 106, 108. Although the substrate 102 shown in FIG. 1 includes three package portions 104, 106, 108 and three cutting areas 110, 112, 114, the substrate 102 may include any other suitable numbers of package portions, and cutting areas located adjacent to at least one of the package portions.

The apparatus 100 also includes a plurality of optical engine packages. In the embodiment shown in FIG. 1, the apparatus 100 includes three optical engine packages 116, 118, 120. Each optical engine package 116, 118, 120 includes a silicon electronic die 122, and two silicon photonic dies 124. The silicon photonic dies 124 of each optical engine package 116, 118, 120 are disposed near or adjacent a first side of a respective optical engine package 116, 118, 120. Each silicon photonic die 124 includes an edge-coupled optical waveguide 126. The silicon electronic dies 122 are disposed near or adjacent an opposing second side of the respective optical engine package 116, 118, 120.

In the embodiment shown in FIG. 1, the silicon electronic die 122 of the optical engine package 116 is disposed on the package portion 104 and the two silicon photonic dies 124 are disposed on both the package portion 104 and the cutting area 110 of the optical engine package 116 such that the edge-coupled optical waveguide 126 of each silicon photonic die 124 is aligned with and overlaps a singulation line 128 between the package portion 104 and the adjacent cutting area 110 of the optical engine package 116. Similarly, the silicon electronic die 122 of the optical engine package 118 is disposed on the package portion 106, and the two silicon photonic dies 124 are disposed on both the package portion 106 and the cutting area 112 of the optical engine package 118 such that the edge-coupled optical waveguide 126 of each silicon photonic die 124 overlaps a singulation line 130 between the package portion 106 and the adjacent cutting area 112 of the optical engine package 118.

The silicon electronic die 122 of the optical engine package 120 is disposed on the package portion 108 and the two silicon photonic dies 124 are disposed on both the package portion 108 and the cutting area 114 such that the edge-coupled optical waveguide 126 of each silicon photonic dies 124 overlaps a singulation line 132 between the package portion 108 and the adjacent cutting area 112 of the optical engine package 120.

The singulation lines 128, 130, 132 are shown in the embodiment in FIG. 1 for the purposes of illustration, and are not visible when the optical engine packages 116, 118, 120 are encapsulated as described further below. The singulation lines 128, 130, 132 represent a boundary between respective the cutting areas 110, 112, 114 and the respective adjacent package portions 104, 106, 108. In an embodiment, the singulation lines 128, 130 and 132 are provided or printed on the boundary between respective the cutting areas 110, 112, 114 and the respective adjacent package portions 104, 106, 108, and are visible before encapsulation of the optical engine packages.

The silicon electronic die 122 and the two silicon photonic dies 124 of each optical engine package 116, 118, 120 are electrically interconnected, for example, by wirebonds, or through flip chip interconnect. Flip chip interconnect includes plating small solder spheres, or copper columns, onto the silicon electronic die 122 and the two silicon photonic dies 124, and attaching the plated silicon electronic die 122 and the two plated silicon photonic dies 124 to the substrate 102 with "bumps" connecting the plated silicon electronic die 122 and the two plated silicon photonic dies 124 to the substrate 102.

In the embodiment of FIG. 1, the apparatus 100 also includes a plurality of fiducials 134, 136, 138 that are marked on the substrate 102 adjacent to the respective singulation lines 128, 130, 132. The fiducials 134, 136, 138 are marked on the substrate 102 in a region 135 that is located outside the optical engine packages 116, 118, 120 so that the fiducials 134, 136, 138 are not obscured by the optical engine packages 116, 118, 120. The fiducials 134, 136, 138 are utilized by cutting equipment to facilitate alignment of a saw to cut along the singulation lines 128, 130, 132. The apparatus 100, in an alternative embodiment, may include alignment markers (not shown) that guide assembly equipment for placing the silicon electronic die 122 and the two silicon photonic dies 124 of each optical engine package 116, 118, 120 on the substrate 102.

Although each optical engine 116, 118, 120 shown in the embodiment in FIG. 1 includes one silicon electronic die and two silicon photonic dies, the optical engine may include any other suitable number of silicon electronic dies and silicon photonic dies, and the number of silicon electronic dies may differ from the number of silicon photonic dies.

Figure 2:
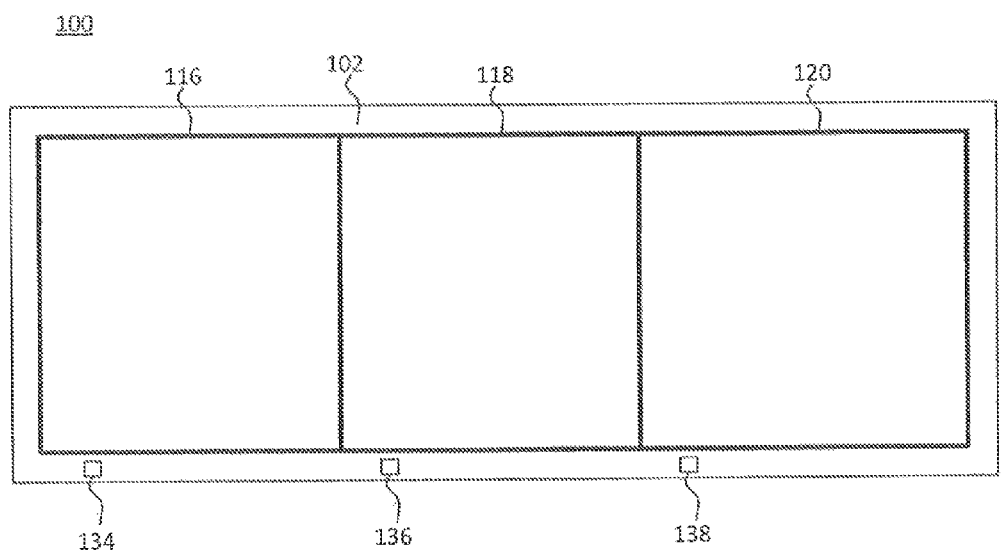
FIG. 2 is a top view of the apparatus of FIG. 1 in accordance with an embodiment of the present disclosure.

FIG. 2 shows a top view of the apparatus 100 of FIG. 1. The apparatus 100 includes the substrate 102, the three optical engine packages 116, 118, 120, and the fiducials 134, 136, 138. FIG. 2 illustrates the apparatus 100 according to an embodiment as it would be viewed in operation, such as in conjunction with a method according to an example embodiment. As seen when comparing FIG. 1 and FIG. 2, the package portions 108 and cutting areas 114 are not visible in FIG. 2, so the fiducials 134, 136, 138 provide a means to identify a location of the singulation lines 128, 130, 132.

Figure 3:
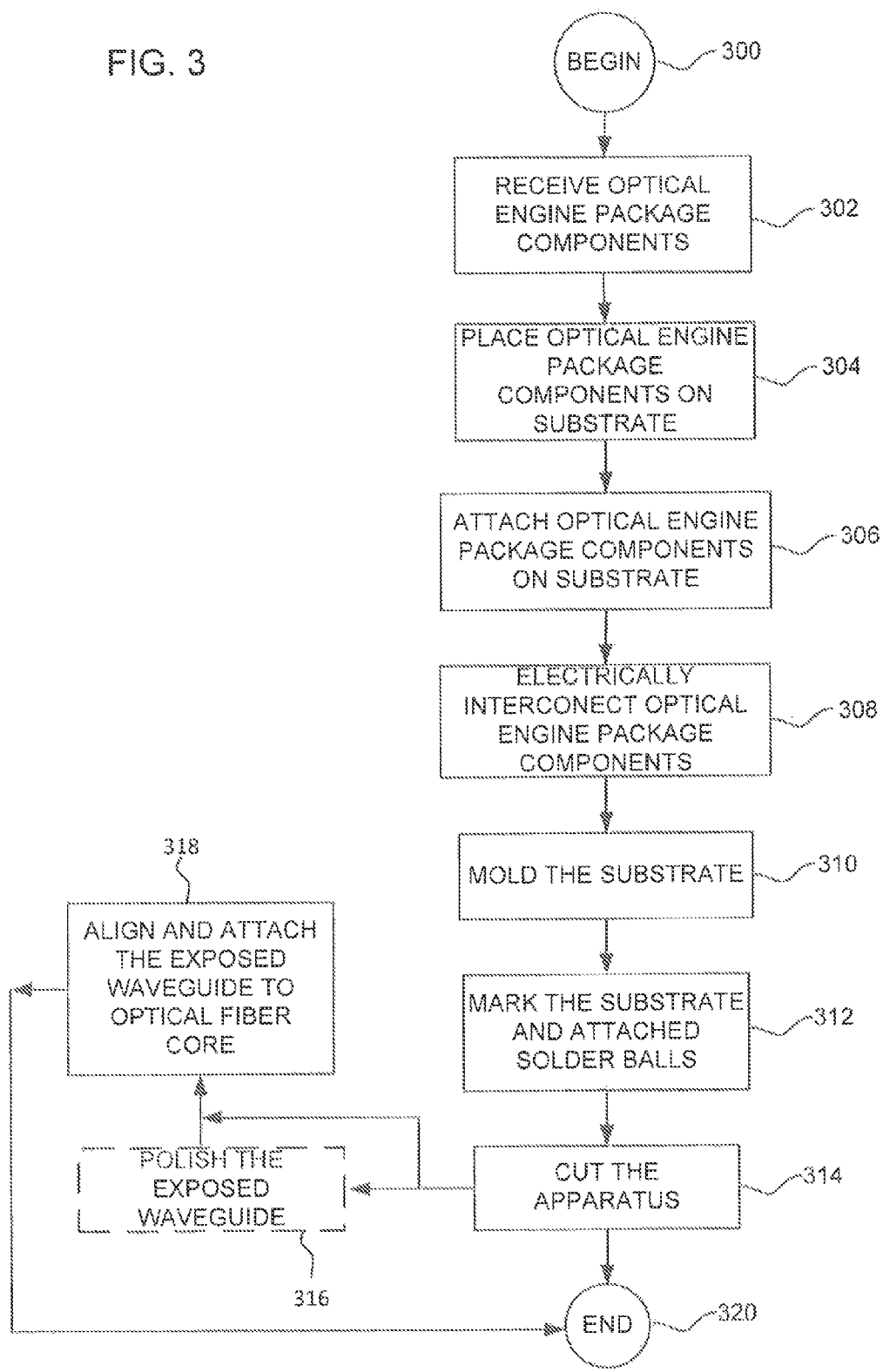
FIG. 3 is a flowchart illustrating a method of manufacturing packages of optical engines in accordance with an embodiment of the present disclosure.

A flowchart illustrating a method for manufacturing optical engine packages in accordance with an embodiment of the present disclosure is shown in FIG. 3. The method may contain additional or fewer processes than shown and/or described.

The method for manufacturing optical engine packages begins at 300. The components of each optical engine package 116, 118, 120, including the silicon electronic die 122, and the two silicon photonic dies 124, and the substrate 102 are received at 302. The substrate 102 that is received may include alignment markers (not shown) that guide assembly equipment for placing the components of each optical engine package 116, 118, 120 on the substrate 102.

After the components of the optical engine packages 116, 118, 120 are received at 302, the optical engine packages 116, 118, 120 are assembled at 304 by placing the respective silicon electronic dies 122 on package portions 104, 106, 108 of the substrate 102 utilizing guide assembly equipment based on alignment markers on the substrate 102. The silicon photonic dies 124 are also placed on the substrate 102 utilizing guide assembly equipment based on alignment markers such that the edge-coupled waveguide 126 of each silicon photonic die 124 is aligned with and overlaps a respective boundary between adjacent cutting areas and package portions, as represented by singulation lines 128, 130, 132 in FIG. 1.

After the components of each optical engine package 116, 118, 120 are placed at 304 on the substrate 102, the components of each optical engine package 116, 118, 120, including the silicon electronic die 122 and the silicon photonic dies 124, are attached at 306 to the substrate 102 utilizing, for example, a curable epoxy or die attach film.

The silicon electronic die 122 and the silicon photonic dies 124 of each optical engine package 116, 118, 120 are then electrically connected together at 308, for example, by wirebonding, to form the optical engine packages 116, 118, 120. Alternatively, the silicon electronic die 122 and the silicon photonic dies 124 of each optical engine package 116, 118, 120 are attached to the substrate 102 utilizing a flip chip interconnect process as described above.

After the silicon electronic die 122 and the silicon photonic dies 124 of each optical engine package 116, 118, 120 are electrically interconnected, the substrate 102 is molded at 310 with, for example, an epoxy molding compound, to encapsulate the silicon electronic die 122, the silicon photonic dies 124, and the wirebonds 126 of each optical engine package 116, 118, 120 on the substrate 102. The wirebonding and the molding process are similar to the assembly process for a package a Low-Profile Fine-Pitch Ball-Grid Array (LFBGA) package, or a Flip-Chip Chip Scale Package (FCCSP) package, and therefore are not described in detail to avoid obscuring the description.

Molding the substrate 102 at 310 encapsulates the substrate 102 with a cap of cured material over each of optical engine package 116, 118, 120. After the mold compound cures, the substrate 102 is marked and solder balls are attached to the substrate 102 at 312. The substrate 102 may be marked with product information utilizing ink or a laser marking system. The product information may include, for example, logos, part numbers, a serial number. The methods of marking of the substrate 120 and attaching the solder balls to the substrate 102 are known to a person of ordinary skill in the art and are therefore not described in detail.

The substrate 102 and the optical engine packages 116, 118, 120 are then cut at 314 along the singulation lines 128, 130, 132 to expose the edge-coupled waveguides of the silicon photonic dies 124 for each optical engine package 116, 118, 120. The cutting 314 of the substrate 102 and the optical engine packages 116, 118, 120 along the singulation lines 128, 130, 132, otherwise known as singulation, separates the optical engine packages 116, 118, 120 and exposes the edge-coupled waveguides of the silicon photonic dies 124 for coupling to an optical fiber core.

The cutting of the substrate 102 and the optical engine packages 116, 118, 120 at 314 may be done, for example, utilizing a sawing table with tooling to guide a saw blade over the singulation lines 128, 130, 132. The saw blade may be guided over the singulation lines 128, 130, 132, utilizing the fiducials 134, 136, 138. In an embodiment, the saw blade may be a diamond blade saw with a coarser grit than is used for silicon wafer singulation because the silicon wafer singulation process only requires sawing through relatively soft materials such as thermoplastics, cured epoxy resins, and thin layers of copper. A blade that is suitable for cutting through silicon may be utilized to control chipping and cracking that may result from sawing through brittle silicon of the silicon photonic die 124.

Optionally, a side of each optical engine package 116, 118, 120 that includes the exposed edge-coupled waveguide may be polished at 316 after the cutting at 314. After a side of each optical engine 116, 118, 120 is polished at 316, an optical fiber core may be aligned with and attached to the exposed edge-coupled waveguide 126 of each optical engine package 116, 118, 120 at 318, and then the methods ends at 320. Alternatively, after the optical engine packages 116, 118, 120 are at cut 314, an optical fiber core may be aligned with and attached to the exposed edge-coupled waveguide 126 of each optical engine package 116, 118, 120, and the method ends at 320.

Figure 4:
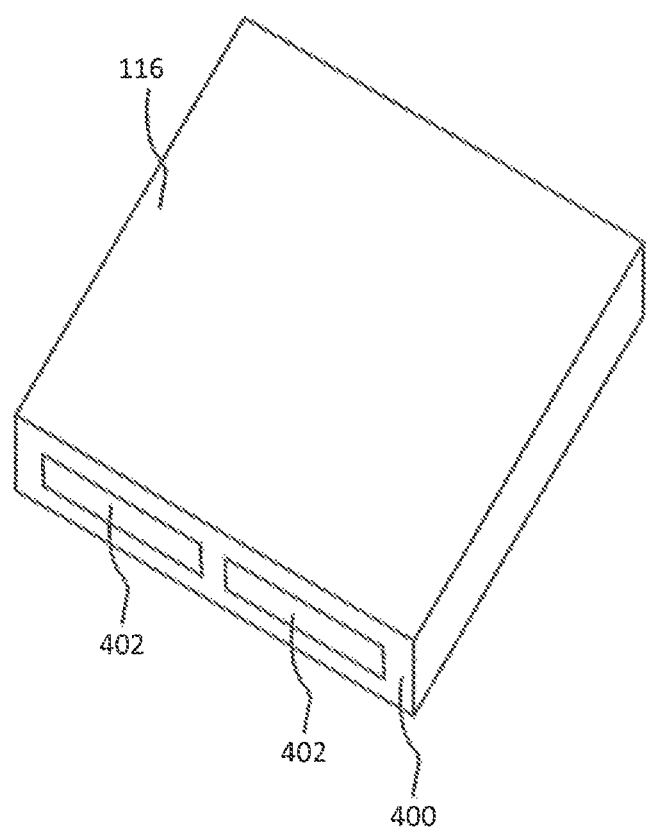
FIG. 4 is a perspective view of an optical engine package manufactured in accordance with an embodiment of the present disclosure.

FIG. 4 illustrates the resulting optical engine package 116, after cutting the substrate 102 and the optical engine package 116, such as utilizing the method of FIG. 3. One side 400 of the optical engine package 116 includes the exposed edge-coupled waveguide 402 of each silicon photonic die 124. The resulting optical engine packages 118, 120, after cutting at 314 in FIG. 3, are similar to the optical engine package 116 and are therefore not shown in detail.

The optical engine packages 116, 118, 120 with the exposed edge-coupled waveguides may then be shipped, for example, in a known semiconductor shipping tray to an optical assembly site, where an optical fiber may be aligned with and attached to the exposed edge-coupled waveguide of each optical engine package 116, 118, 120.

The side 400 of the optical engine package 116, 118, 120 with the exposed edge-coupled waveguide may be polished at 316 before alignment and attachment of an optical fiber thereto so as to provide a smooth surface to facilitate light transmission between the edge-coupled waveguide and the fiber core. In an example embodiment, the side 400 of each optical engine package 116, 118, 120 is polished utilizing a jig that may accommodate multiple optical engine packages and may align all the optical engine packages to a specific angle against a polishing plate with the appropriate grit of diamond paste. Examples of such a jig are known to a person of ordinary skill in the art, one example of which is a jib manufactured by Krell Technologies. Various angles of polishing control the back reflection of the light at the interface between edge-coupled waveguides of each optical engine package and fiber. In an alternative embodiment, the side 400 of each optical engine package 116, 118, 120 is polished utilizing other suitable means, for example, manually polishing.

After polishing, the alignment for attachment to an optical fiber may be performed using an active optical alignment stage using a pre-fabricated fiber array. The pitch and the position of the fibers may be matched with that of the edge-coupled waveguides of the silicon photonic die 124 during the design of the fiber array, with the rough alignment being performed using the edges of the silicon photonic die 124 as a guide. Once the fiber array is aligned with each optical engine package 116, 118, 120, an ultra-violet (UV) curable epoxy may be dispensed to secure the fiber array in place and result in a completed optical engine package 116, 118, 120 pigtailed with an optical fiber core. Each optical engine package 116, 118, 120 may then be socketed onto an application board, or soldered down onto the application board using, for example, a Surface-Mount Technology (SMT) process.

The method of the present disclosure may also be used, in both single mode and multimode applications, with free-space alignment optics instead of direct fiber attach. In the embodiment in which free-space alignment optics are used, a lens array may be aligned to the package facet instead of a fiber array.

Advantageously, the method of manufacturing optical engine packages of the present disclosure is highly scalable so that multiple optical engine packages may be manufactured in parallel utilizing standard silicon wafer processing flows. This reduces the amount of packaging material utilized in manufacturing optical engine packages, reduces the throughput and labor required to manufacture optical engine packages, and significantly reduces the costs associated with manufacturing optical engine packages.

In the preceding description, for purposes of explanation, numerous details are set forth in order to provide a thorough understanding of the embodiments. However, it will be apparent to one skilled in the art that these specific details are not required. In other instances, well-known electrical structures and circuits are shown in block diagram form in order not to obscure the understanding.

The above-described embodiments are intended to be examples only. Alterations, modifications, and variations can be effected to the particular embodiments by those of skill in the art without departing from the scope, which is defined solely by the claims appended hereto.

What is claimed is:

1. An apparatus from which one or more optical engine packages are manufactured, the apparatus comprising:
   a substrate defining a package portion and a cutting area, the package portion being delimited from the cutting area by a boundary;
   a silicon photonic die attached to the substrate, the silicon photonic die defining a waveguide, a portion of the waveguide being located in the cutting area, another portion of the waveguide being located in the package portion; and
   a molding encapsulating the silicon photonic die and the substrate,
   the apparatus being configured to produce, after being cut along the boundary, an optical engine package defining an edge of the waveguide for optical coupling to an optical fiber core.

2. The apparatus according to claim 1, wherein the substrate is a low temperature co-fired ceramic (LTCC) substrate.

3. The apparatus according to claim 1, wherein the substrate is an organic laminate substrate.

4. The apparatus according to claim 1, wherein the optical engine package further comprises a silicon electronic die electrically interconnected to the silicon photonic die.

5. The apparatus according to claim 1, wherein the package portion is a first package portion, the cutting area is a first cutting area, the boundary is a first boundary, the silicon photonic die is a first silicon photonic die, the waveguide is a first waveguide, the optical engine package is a first optical engine package and the optical fiber core is a first optical fiber core, the apparatus further comprising a second silicon photonic die attached to the substrate, the second silicon photonic die defining a second waveguide, and wherein:
  the substrate defines a second package portion and a second cutting area, a portion of the second waveguide being located in the second cutting area, another portion of the second waveguide being located in the second package portion, the molding further encapsulating the second silicon photonic die;
  the apparatus being configured to produce, after being cut along the second boundary, a second optical engine package defining an edge of the second waveguide for optical coupling to a second optical fiber core.

\* \* \* \* \*